United States Patent
Tachikawa et al.

[11] Patent Number: 5,837,941
[45] Date of Patent: Nov. 17, 1998

[54] SUPERCONDUCTOR WIRE

[75] Inventors: Kyoji Tachikawa; Yasuzo Tanaka; Kaname Matsumoto; Hisaki Sakamoto, all of Tokyo, Japan

[73] Assignees: Tokai University; The Furukawa Electric Co., Ltd., both of Tokyo, Japan

[21] Appl. No.: 291,355

[22] Filed: Aug. 16, 1994

Related U.S. Application Data

[63] Continuation of Ser. No. 651,257, filed as PCT/JP90/00622 May 17, 1990, published as WO91/02,364 Feb. 21, 1991, abandoned.

[30] Foreign Application Priority Data

Aug. 9, 1989 [JP] Japan .................................. 1-206292

[51] Int. Cl.$^6$ .................................................. H01B 12/00
[52] U.S. Cl. .................... 174/125.1; 505/884; 505/887
[58] Field of Search .............................. 174/125.1, 15.4, 174/15.5, 126.1; 505/884, 886, 887

[56] References Cited

U.S. PATENT DOCUMENTS

| | | |
|---|---|---|
| 3,963,425 | 6/1976 | Sambrook . |
| 3,983,521 | 9/1976 | Furuto et al. ................ 174/126.1 X |
| 3,996,661 | 12/1976 | Ziegler et al. ........................ 29/599 |
| 4,109,374 | 8/1978 | Whetstone et al. ............... 174/125.1 |
| 4,321,749 | 3/1982 | Tachikawa et al. ................... 29/599 |
| 4,409,297 | 10/1983 | Howe .......................... 174/125.1 X |
| 4,435,228 | 3/1984 | Tachikawa et al. .............. 148/11.5 Q |
| 4,687,883 | 8/1987 | Flukiger et al. . |
| 4,990,411 | 2/1991 | Nakayama et al. . |

FOREIGN PATENT DOCUMENTS

| | | |
|---|---|---|
| 0346124 | 12/1989 | European Pat. Off. . |
| 0221232 | 5/1987 | Germany . |
| 57-12245 | 3/1982 | Japan . |
| 59-141106 | 8/1984 | Japan . |
| 59-211909 | 11/1984 | Japan . |
| 62-268008 | 11/1987 | Japan . |
| 63-164115 | 7/1988 | Japan . |
| 63-164116 | 7/1988 | Japan . |
| 63-216212 | 9/1988 | Japan . |
| 1205130 | 9/1970 | United Kingdom . |

OTHER PUBLICATIONS

IEEE Transactions of Magnetics, vol. 25, No. 2, Mar. 1989, pp. 1953–1955, Goldfarb, R.B. et al, "Magnetic Evaluation of Cu–Mn Matrix Material for Fine–Filament NB–TI Superconductors".

IEEE Transactions of Magnetics, vol. 25, No. 2, Mar. 1989 pp. 2204–2207, Kanithi, H.C. et al, "Low Loss and High Current NB3SN Conductors Made by the Internal–Tin Method".

Proceedings of the IEEE, vol. 77, No. 8, Aug. 1989, Gregory E. et al, "Conventional Wire and Cable Technology".

Max Hansen. "Constitution of Binary Alloys" Second Edition, 1958, McGraw–Hill Book Company, Inc. pp. 585–587, 629–633.

*Primary Examiner*—Hyung S. Sough
*Attorney, Agent, or Firm*—Frishauf, Holtz, Goodman, Langer & Chick, P.C.

[57] ABSTRACT

A superconductor wire comprising a plurality of Nb—Ti superconductor filaments embedded in a copper matrix made of a copper alloy other than a two element copper alloy selected from the group consisting of a Cu—Ni alloy, a Cu—Sn alloy and a Cu—Mn alloy, wherein the resistivity (Z) at room temperature of the copper matrix is $2\times10^{-8}$ $\Omega$m to $65\times10^{-8}$ $\Omega$m, and the distance between superconductor filaments is not less than $0.0625\times1/\sqrt{Z}$ nm. The superconductor wire has a high critical current density, a small AC loss and improved workability.

12 Claims, 4 Drawing Sheets

PRIOR ART

SUPERCONDUCTOR WIRE

This application is a Continuation of application Ser. No. 07/651.257, filed Apr. 3 1991, now abandoned, which is the United States national phase application of International Application No. PCT/JP90/00622 filed May 17, 1990, published as WO91/02364 Feb. 21, 1991.

TECHNICAL FIELD

The present invention relates to a superconductor wire having an excellent copper alloy matrix composition and structure.

BACKGROUND ART

Nb—Ti superconductor materials were found in 1960s, and a so-called extra fine multi-core wire obtained by embedding a large number of extra fine cores made of such a material in a Cu matrix was developed in 1970s. The extra fine multi-core wires have been most popular as practical superconductor wires because they are electro-magnetically stable.

The critical current density (Jc) of a practical Nb—Ti extra fine multi-core wire is increased as follows. An Nb—Ti material is intensively cold-drawn and heat-treated at a temperature of 300° to 400° C. to precipitate a fine αTi phase in the Nb—Ti alloy, thereby increasing the critical current density (Jc). The resultant material is aged and heat-treated, and is then drawn to further increase the critical current density (Jc).

Even in an extra fine multi-core superconductor wire, however, a coupling current flows between the cores to cause a power loss when a change in magnetic field is fast, as has come to light later. In particular, when an AC magnetic field is required as in a power generator or transformer, or when a pulsed magnetic field is required as in energy storage or nuclear fusion, this power loss causes a serious problem.

In order to solve this problem, a so-called Nb—Ti/Cu/Cu—Ni of three-layered and extra fine multi-core wire is developed to cut off a coupling current between the extra fine cores. In this wire, a barrier consisting of a Cu—Ni alloy layer having a high electric resistance is formed inside the extra fine multi-core wire. The Cu—Ni alloy layer may be arranged around each Nb—Ti extra fine core or may be arranged as a partition wall in the Cu matrix.

An alloy resistance layer (barrier alloy layer) formed to cut off a coupling current between the Nb—Ti extra fine cores must have good workability, a hardness close to that of the Nb—Ti alloy, and a high resistance. Judging from these viewpoints, a Cu—Ni alloy (cupro-nick-el, Cu-about 50 atm % Ni) is used in a conventional Nb—Ti extra fine multi-core wire. The barrier alloy layer is most effectively formed around each Nb—Ti extra fine core. In a Cu—Ni alloy, however, Cu and Ni cause a diffusion reaction with the Nb—Ti extra fine cores to form a compound layer which causes disconnections or degrades superconductive properties of the Nb—Ti extra fine cores. When a heat treatment is performed after strong drawing is performed, the above diffusion reaction tends to occur easily. In particular, Ni easily reacts with the Nb—Ti alloy. Further, since Ni is a ferromagnetic element, it causes extreme degradation of the superconductive properties of the Nb—Ti alloy.

Figure 9:
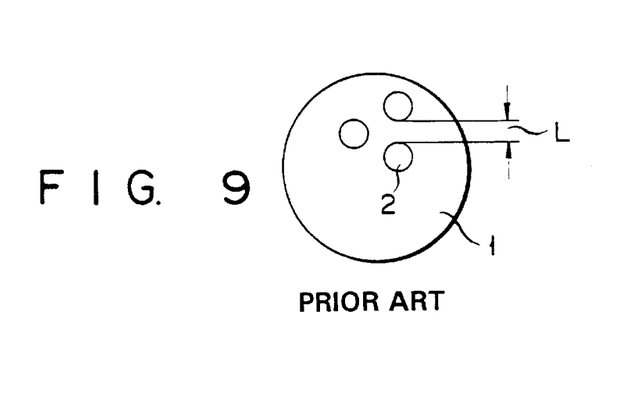
FIG. 9 is a sectional view showing a conventional superconductor wire.

As shown in FIG. 9, conventional superconductor wires are classified into a wire obtained by combining Nb—Ti filaments 2 in a Cu—Ni alloy matrix 1, or $Nb_3Sn$ compound filaments 2 in a Cu-Sn alloy matrix 1.

In these superconductor wires, the superconductor filaments 2 are located in the metal matrix 1 to assure a filament distance (L) which does not cause electromagnetic coupling of the filaments in a superconductive state.

That is, these superconductor wires have a so-called multi-core structure. The superconductor filament distance L is apparently closely associated with a resistivity of the matrix metal 1 at a temperature slightly higher than that of the superconductive state. The superconductor wires are empirically designed to simultaneously satisfy conditions, i.e., a high critical current density, a small AC loss, and good workability. However, in practice, optimal design cannot be achieved.

The following problems are posed by conventional superconductor wire designs.

a. A copper matrix alloy is mostly a two-element alloy such as Cu—Ni, Cu—Mn, or Cu—Sn which is obtainable by simple blending. Rarely, a third element is added to improve superconductive properties such that $Hc_2$ is added to a superconductor wire made of $Nb_3Sn$. These materials are not inherently excellent in castability and workability. Therefore, composite workability with a superconductor wire is limited.

b. In order to reduce the amounts of alloy elements of a copper alloy so as to improve workability, the resistivity of the matrix metal is decreased, and the superconductor filaments are electromagnetically coupled, thereby increasing an AC loss.

c. However, when a distance between superconductor filaments is increased to prevent coupling therebetween, an amount of filaments per unit volume is decreased, and therefore the critical current density is decreased.

Disclosure of Invention

It is an object of the present invention to provide a superconductor wire which does not contain a toxic element and having an effective coupling current barrier capable of directly covering a superconductor core.

It is another object of the present invention to provide a superconductor wire having a high critical current density, a small AC loss, and a copper alloy matrix composition and structure excellent in workability.

According to the present invention, there is provided a superconductor wire obtained by embedding a plurality of metal superconductor filaments in a copper alloy matrix, characterized in that a copper alloy of the matrix contains at least one kind of element belonging to the following groups A to J and excluding Cu—Ni, Cu—Sn, and Cu—Mn, contents of the alloy elements a condition that a resistivity (Z) of the copper alloy at room temperature is not less than $2 \times 10^{-8}$ Ωm and not more than $65 \times 10^{-8}$ Ωm, and a distance between the metal superconductor filaments is not less than $0.0625 \times 1/\sqrt{Z}$ nm:

A: Zr, Zn, Ag, Pt, In, Au.
B: Sn, Ni, Pb, Gd, Pd, Bi.
C: Al, Ir, Mg.
D: Sb, Mn, Rh, Ge.
E: Cr, Be.
F: As.
G: Si, Co.
H: Fe.
I: P.
J: Ti.

wherein the resistivity (Z) is calculated with the following formula (0):

$Z(\Omega m) = 1.68 \times 10^{-8} + 1.2(0.5 X_A + X_B + 2X_C + 3X_D + 4X_E + 5X_F + 6X_G +$ $$10X_H + 15X_I + 17.5X_J) \times 10^{-8} \qquad (0)$$

where symbol $X_A$ to $X_J$ are wt % of the alloy elements belonging to the element groups A to J.

As a copper alloy constituting the matrix, a copper alloy containing at least three kinds of elements belonging to the groups A to J can be used. Likewise, for a copper alloy constituting the matrix, an alloy containing at least one element out of Group 4B can be used.

For a copper alloy constituting the matrix, a Cu-1 to 10 atomic percentage (hereafter, atm %) Si alloy can be used.

For a copper alloy constituting the matrix, a Cu-1 to 10 atm % Ge alloy can be used.

For a copper alloy constituting the matrix, a Cu-1 to 10 atm % (Si+Ge) alloy can be used.

For a copper alloy constituting the matrix, any alloy represented by the following condition (I) can be used:

$$0.05 \leq X_D + X_G + X_H \leq 5.0 \qquad (I)$$

For a copper alloy constituting the matrix, an alloy represented by the following conditions (II) can be used:

$$0.4 \leq X_C/X_D \leq 0.7$$

and $$0.5 \leq X_C \leq 6.5$$

and $$0.1 \leq X_D \leq 12.5 \qquad (II)$$

For a metal superconductor filament, an $Nb_3Sn$ or Nb—Ti alloy filament can be used.

The present invention is based on the experimental results obtained by systematically varying the kinds and content of alloy elements of copper matrices of superconductor wires. More specifically, a linear relationship between the resistivity Z at room temperature and the contents of the alloy elements is experimentally obtained, the contents of the alloy elements are determined to cause the resistivity Z to fall within the range of $2 \times 10^{-8}$ Ωm to $65 \times 10^{-8}$ Ωm and the distance between the superconductor filaments to be $0.0625 \times 1/\sqrt{Z}$ nm or more, thereby solving the problems presented by the superconductor wire designs.

The resistivity Z is determined to fall within the range of $2 \times 10^{-8}$ Ωm to $65 \times 10^{-8}$ Ωm due to the following reason. When the resistivity is $2 \times 10^{-8}$ Ωm or less, a copper alloy matrix resistance is low as in a conventional DC superconductor wire (pure copper matrix), and coupling between the superconductor filaments is large. The superconductor filaments cannot be located close to each other, and the critical current cannot be increased. When the resistivity is $65 \times 10^{-8}$ Ωm or more, cold workability such as cold drawability is degraded. Intermediate annealing must be performed to obtain an extra fine wire on the order of submicrons, and workability is degraded due to an interface reaction between the superconductor filaments.

The distance between the superconductor filaments is $0.0625 \times 1/\sqrt{Z}$ nm or more because the superconductor filaments can be excited at an economical speed and superconductor wires can be used in a variety of applications, namely, pulsed and AC magnetic fields. If the distance is smaller than that, the superconductor filaments are coupled to no longer have a nature of a multi-core structure. In this case, the multi-core wire behaves as a single core wire which is not suitable for quick excitation or an AC application.

When the condition $0.05 \leq X_D + X_G + X_H \leq 5.0$ is met, it may be a certain elemental aggregate which serves to improve cold workability and temper electromagnetic coupling between the superconductor filaments. Besides it may prevent critical current density from dropping in the submicron region.

If the conditions; $0.4 \leq X_C/X_D \leq 0.7$, $0.5 \leq X_C \leq 6.5$, and $0.1 \leq X_D \leq 12.5$ are met, these may serve to prevent $HC_2$ from dropping as the superconductor filaments come closer due to the interaction of those elements.

The present invention covers a superconductor wire having a composite structure with a stabilizing metal which is or is not in contact with superconductor filaments, and a superconductor alloy wire containing, as a barrier alloy, an alloy containing at least either of Si and Ge in Cu, with a total amount of 1 to 10 atm %.

In practice, it is typical of a stabilizing metal to be selected out of Cu, Al, Ag and the like due to an economical advantage.

Si and Ge belong to the same group of the Periodic Table. A Cu alloy containing 1 to 10 atm % of these elements is excellent in fluidity (molten flow) in a molten state. A nondefective ingot can be cast in melting such an alloy with a high yield rate. In addition, such an alloy has excellent workability and mechanical properties close to those of an Nb—Ti or $Nb_3Sn$ alloy, and is combined with a superconductor alloy to be suited for intensive drawing. At the time of a heat treatment, the superconductive characteristics are not degraded even if the alloy causes a diffusion reaction with superconductor alloy cores.

The content of Si and Ge is limited to fall within the range of 1 to 10 atm % due to the following reason. When the content is 1 atm % or less, a coupling current cutoff function is insufficient. When the content is 10 atm % or more, workability is degraded, which is not suitably applied to satisfy the objects of the present invention. In particular, the total content of one or both of Si and Ge preferably falls within the range of 2 to 7 atm %.

A Cu—Si alloy of the present invention is much cheaper than a conventional Cu—Ni alloy.

Embodiments of such extra fine multi-core superconductor wires according to the present invention will be described with reference to the accompanying drawings. FIGS. 1 to 5 show cross sectional elements of various types of superconductor wires.

In FIGS. 1 to 5, reference numeral 1 denotes each superconductor core made of Nb—Ti or the like; 2, a stabilizing metal (e.g., Cu, Al, Ag or the like); 2a, a barrier alloy layer (a Cu—Si alloy, a Cu—Ge alloy, or a Cu—Si—Ge alloy); and 3, a Cu alloy matrix metal layer.

Figure 1:
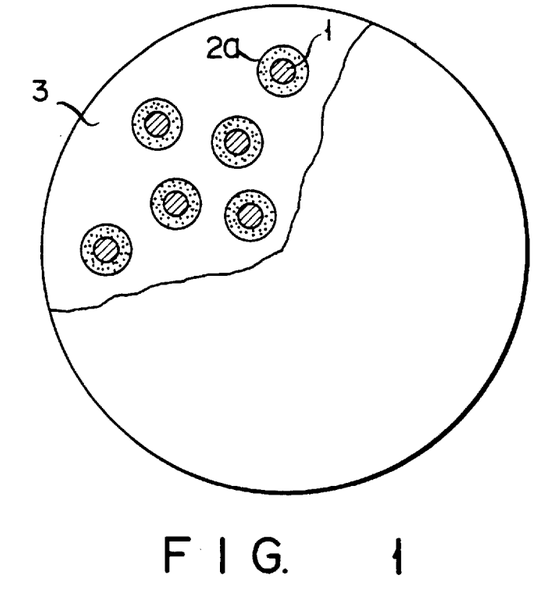
FIGS. 1 to 5 are views for explaining sectional elements of various types of superconductor extra fine multi-core wires according to the present invention.

Referring to FIG. 1, a composite body obtained by inserting a superconductor alloy base rod made of Nb—Ti or the like into a barrier alloy tube, is drawn. By inserting a large number of these composite wires into a Cu alloy tube having a predetermined composition, and through drawing, there results in such a superconductor wire as shown in FIG. 1 about its cross section.

Figure 2:
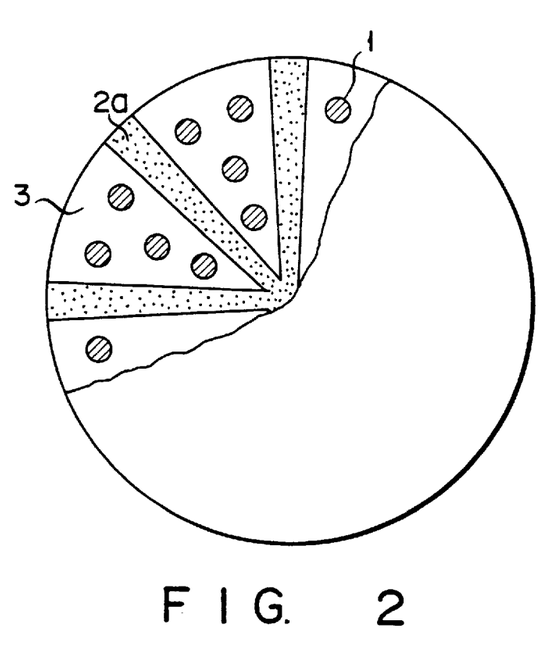
Figure 3:
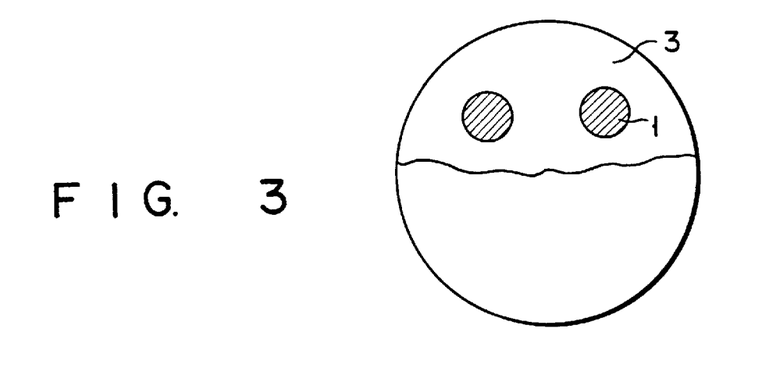
Figure 4:
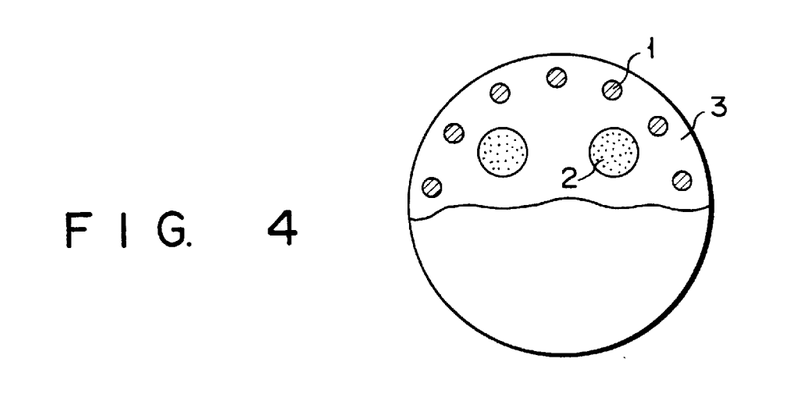
Figure 5:
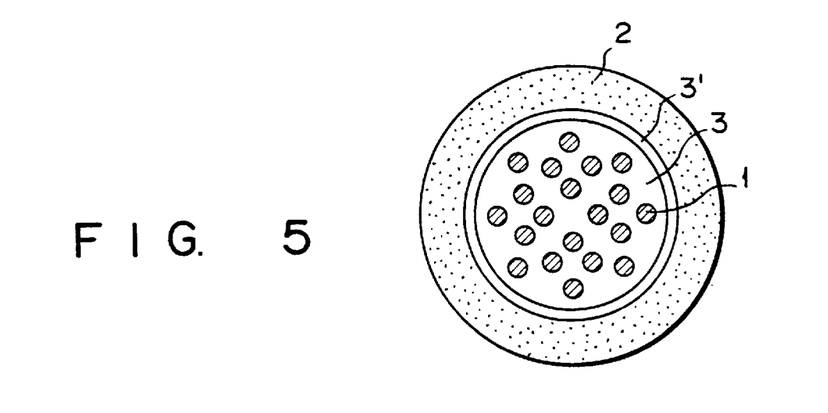

In this case, the barrier alloy and the Cu matrix alloy may replace each other. That is, a superconductor alloy rod made of Nb—Ti may be inserted into a barrier alloy tube, and the resultant structure may be drawn. As shown in FIG. 2, the barrier alloy may be located in a Cu matrix so as to serve as a coupling current barrier. In place of the copper alloy, the matrix metal may be replaced with Cu used as a conventional stabilizing metal, or Al or Ag having good conductivities as in Cu. The composite superconductor extra fine multicore wire is aging heat-treated at a temperature of 300° to 400° C. to increase the critical current density (Jc), as previously described. Even more, some process is repeated, if needed. Likewise, the superconductor extra fine multi-core wire may be twisted or braided to uniform a current distribution and improve electromagnetic stability, or may be shielded with an insulating layer.

BEST MODE FOR CARRYING OUT THE INVENTION

The examples in embodying this invention are described as follows, with reference to the attached drawings.

EXAMPLE 1

Figure 6:
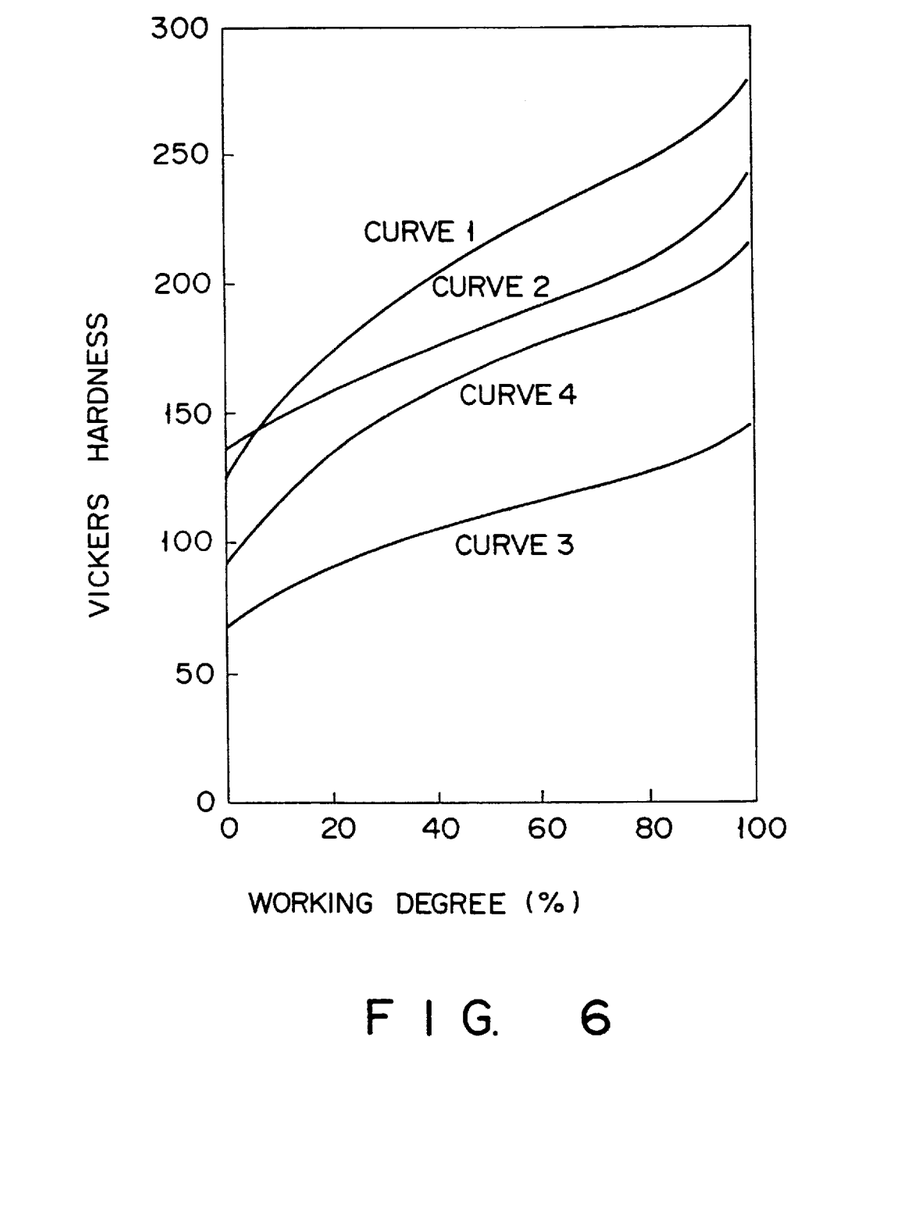
FIG. 6 is a graph showing changes in Vickers hardness values of constituting elements of an Nb—Ti superconductor wire according to examples of the present invention as a function of degree of working, in which a curve 1 represents changes of a Cu-5 atm % Si alloy of Example 1, a curve 2 represents changes of an Nb—Ti alloy core of Example 1, a curve 3 represents changes of Cu of Example 1, and a curve 4 represents changes of a Cu-3 atm % Ge alloy of Example 2.

An alloy of Cu containing 5 atm % of Si was melted in a graphite melting pot in air to obtain a rod-like ingot having a diameter of 15 mm. A commercially available Cu—Si matrix alloy (Si content: about 30 atm %) was used to add Si in the above alloy. A hole having a diameter of 6 mm was formed in this ingot, and an Nb-67 atm % Ti alloy rod was inserted into this ingot hole. This composite body was flute-rolled, swaged, and drawn to obtain an elongated wire having an outer diameter of 0.7 mm. The workability of this composite body was excellent, and intermediate annealing was not required during the work. Curves 1 and 2 in FIG. 6 show changes in Vickers hardness values of the Cu—Si alloy and the Nb—Ti alloy core as a function of degree of working, respectively.

The hardness of the Cu—Si alloy is close to that of the Nb—Ti alloy, and the composite working can be performed on these alloys without deteriorating the properties. A curve 3 in FIG. 6 represents changes in Vickers hardness values of Cu as a function of degree of working.

A sample was obtained from this elongated wire and was heat-treated at 350° C. for 24 hours to increase Jc. A superconductive critical temperature (Tc) was determined by sensing a change in magnetic susceptibility. According to the method of magnetic susceptibility, a Tc value of a surface layer of the Nb—Ti alloy core can be measured. The test results are shown in Table 1 below. The Tc value is equal to that of an Nb—Ti alloy wire combined with pure Cu. It is thus apparent that no degradation caused by Si diffusion from the barrier alloy occurs. However, the Tc value of the a Nb—Ti alloy wire made by covering cores with a Cu—Ni alloy by a conventional technique is decreased, thereby representing substantial degradation of the Nb—Ti superconductor alloy by Ni diffusion.

EXAMPLE 2

A rod-like Cu-3 atm % Ge alloy ingot was prepared following the same procedures as in Example 1. Ge was added such that a predetermined amount of pure Ge was added to molten Cu. Following the same procedures as in Example 1, a composite body of the ingot and an Nb-67 atm % Ti alloy was obtained, and an elongated wire sample was prepared. Workability of this composite body was also excellent, and intermediate annealing was not required during the work. Changes in Vickers hardness value of a Cu-3 atm % Ge alloy were represented by a curve 4 in FIG. 3 and are similar to those of the Nb—Ti alloy. A sample obtained from the elongated wire was heat-treated at 350° C. for 24 hours, and a Tc value was measured. The test results are shown in Table 1. A decrease in Tc caused by Ge addition does not occur, and the properties of the Nb—Ti alloy core are not degraded by Ge diffusion.

EXAMPLE 3

Following the same procedures as in Examples 1 and 2, a Cu-3 atm % Si-1 atm % Ge alloy rod was prepared and a hole having a diameter of 6 mm was formed in the rod to prepare a composite body of the rod and an Nb-67 atm % Ti alloy core, thereby forming an elongated wire sample. The workability of this composite body was excellent as in the samples of Examples 1 and 2. A sample obtained from the elongated wire was heat-treated at 350° C. for 24 hours, and its (TC) value was determined by sensing a change in magnetic susceptibility. Any deterioration in Tc value due to simultaneous addition of Si and Ge was not found at all.

Since a Cu-based alloy containing 1 to 10 atm % of Si and/or Ge is used as a barrier alloy, a diffusion reaction with the Nb—Ti alloy core can not degrade the properties of the superconductor wire. Therefore, the performance of the Nb—Ti superconductor wires currently used in a variety of applications can be improved. In addition, since castability and workability of the barrier alloy of the present invention are excellent, an Nb—Ti extra fine multi-core superconductor wire having excellent practical applicability can be made available.

Table 2 below shows constitutional elements of 25 types of copper alloys used in Examples 4 to 7 of the present invention.

EXAMPLE 4

Alloy samples having alloy Nos. 1, 2, 7, and 8 were melted in a vacuum melting furnace and were annealed uniformly. The annealed samples were heated at 800° C. for an hour to be extruded materials each having a diameter of 55 mm. Each of these materials, an Nb-50% wt Ti alloy, and OFC copper were combined by a three-time stacking technique to obtain a sectional surface ratio of Cu:copper alloy:NbTi alloy=1:4:1.

The number of Nb—Ti alloy cores was about 41,700. Critical current densities (Jc) and AC losses of wires each having an outer diameter of 0.5 mm (twist pitch: 4 mm) and wires each having an outer diameter of 0.1 mm (twist pitch: 0.8 mm) were measured. Test results are shown in Table 3. These wires were heat-treated with an outer diameter of 1 mm at 380° C. for 2 hours.

Judging from the above test results, the samples having alloy Nos. 7 and 8 have better workability than that of the samples having alloy Nos. 1 and 2. The sample having alloy No. 7 and the small diameter of 0.1 mm (superconductor filament diameter: about 0.2 μm) has a higher critical current density (Jc) and a lower AC loss than those of the sample having alloy No. 1 and having the same diameter.

The sample having alloy No. 8 and the small diameter has a higher Jc value than that of the sample having alloy No. 2 and the same diameter as that of alloy No. 8. The AC loss of the sample having alloy No. 8 is decreased, as compared with the superconductor filament diameter. A measurement result of a distance between superconductor filaments of a wire having a diameter of 0.1 mm is about 148 nm. Some of the superconductor filaments of the sample having alloy No. 1 are assumed to be coupled to result in an increase of AC loss. Although the sample having alloy No. 2 has a low AC loss, it has small contents of alloy elements, thus resulting in poor workability. That is, the condition of the superconductor filament distance being 0.0625/Z or more is satisfied by the samples alloy Nos. 2, 7, and 8. However, the sample having alloy No. 2 has poor workability and cannot be used in practice.

EXAMPLE 5

Samples having alloy Nos. 3, 4, 5, 6, 9, 10, 11, 12, 13, 14, and 15 shown in Table 2 were prepared, and composite superconductor wires having outer diameters of 0.5 mm and 0.1 mm were prepared following the same procedures as in Example 4. The workability during the manufacture and superconductor properties were tested, and test results shown in Table 4 below were obtained.

Judging from these test results, the following facts were found.
  a. The frequency of disconnections during drawing of the samples having alloy Nos. 3, 4, 5, and 6 is high, and twisting workability of these samples is poor. Each of these samples cannot be twisted at a pitch 15 times the wire diameter or less.
  b. The workability of the samples having alloy Nos. 9, 10, 12, and 13 is better than that of other samples.
  c. The samples having alloy Nos. 9, 10, 12, and 13 each containing three or more kinds of elements have good workability, and the Nb—Ti superconductor filament diameters of these samples are uniform (about 1 $\mu$m for a wire diameter of 0.5 mm; and about 0.2 $\mu$m for a wire diameter of 0.1 mm). In addition, since the distance between the superconductor filaments is smaller than the measured value (about 148 nm) of the wire having a diameter of 0.1 mm, the superconductor filaments are independent of each other. The ratio of AC loss: $P_{0.5}$ (AC loss in 0.5 mm diameter) to $P_{0.1}$ (AC loss in 0.1 mm diameter), corresponds approximately to the theoretical ratio, 5. Judging from the expected distances between the superconductor filaments, the superconductor filaments must be independent of each other in other alloys. However, the measurement results of the wires having a diameter of 0.1 mm have large AC losses, and the superconductor filaments of these wires are surmised to have substantially coupled to each other.

Figure 7:
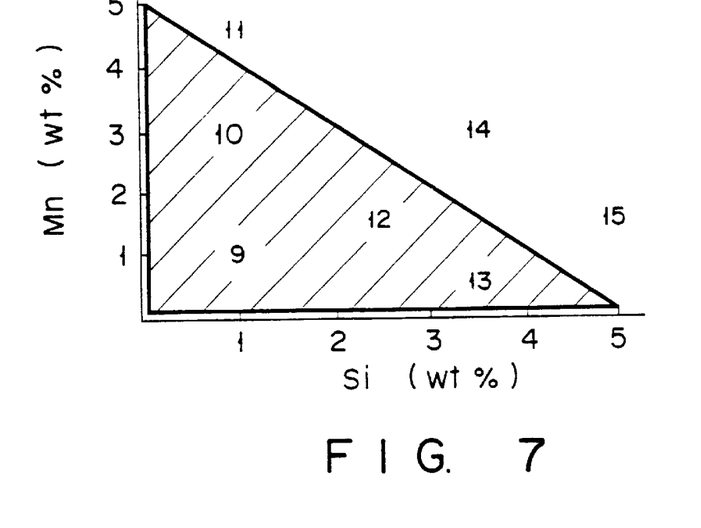
FIG. 7 is a view showing a preferable composition range of a copper alloy matrix (Mn—Si—Cu) of a superconductor wire according to the present invention.

FIG. 7 shows a composition distribution of Mn and Si of Example 5. The composition preferably falls within the range of $0.05<X_{Mn}+X_{Si}<5.0$. Since a pure two-element material has poor workability, both Mn and Si must exist as a trace of composition.

EXAMPLE 6

Samples having alloy Nos. 6 and 16 to 21 shown in Table 2 were prepared, and each of the samples, Cu, and an Nb-46.5 wt % Ti alloy were combined by a three-time stacking technique, following the same procedures as in Example 4.

In the first stacking cycle, a one-core wire sectional ratio was set at, copper alloy : Nb—Ti=0.5:1, in the second stacking cycle, a 19-core wire sectional ratio was set at, copper alloy : Nb—Ti=2:1, and in the third stacking cycle, a sectional ratio was set at, copper : copper alloy : Nb—Ti= 1:4:1, thereby fixing final wire diameters of 0.5 mm and 0.1 mm. The resultant samples were heated at 380° C. for an hour. Jc numbers and AC losses of these samples were measured. Test results are shown in Table 5 below.

The workability of these wire samples was as follows. Each of the samples having alloy Nos. 6 and 20 was disconnected 10 to 20 times until the wire was drawn to a diameter of 0.1 mm. Other samples were disconnected a few times, thus exhibiting relatively good workability.

Figure 8:
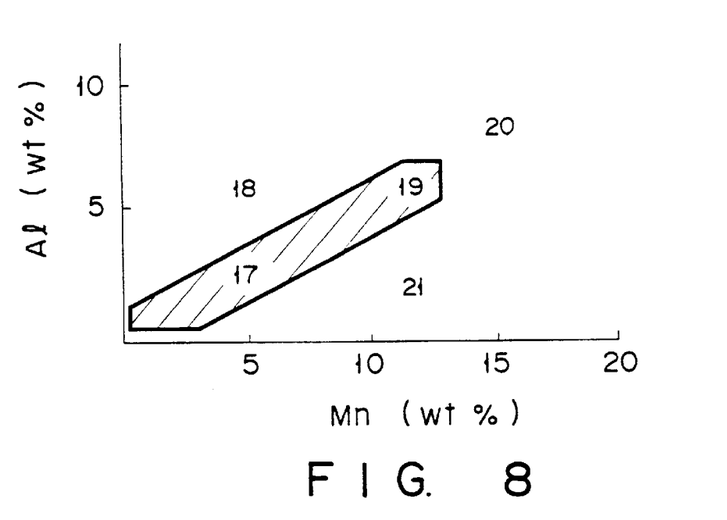
FIG. 8 is a view for explaining a preferable composition range of a copper alloy matrix (Al—Mn—Cu) of another superconductor wire according to the present invention.

In the case of diameter, 0.1 mm, Jc of Alloy No. 7 and 19 with a ratio ($X_C/X_D$) of 0.5, have risen up to 1.5–2 times as large as the other wire material's. That is, as shown in FIG. 8, the samples having alloy Nos. 17 and 19 satisfy conditions $0.4 \leq X_C/X_D \leq 0.7$, $0.5 \leq X_C \leq 6.5$ and $0.1 \leq X_D \leq 12.5$.

The measured value of the superconductor filament distance has a margin large enough as compared with the measured value of 148 nm. Some of the superconductor filaments were expected to come close to each other due to the AC loss ratio $P_{0.5}/P_{0.1}$. Contrary to this interference, the samples having alloy NOs. 17 and 19 have low AC losses and larger Jc number, thus providing special effects. The Cold workability of the samples having alloy Nos. 16 and 20 was poor, and that of other samples was fair.

EXAMPLE 7

Copper alloys having alloy Nos. 22 to 25 shown in Table 2 were melted in a vacuum melting furnace and were hot-extruded at 750° C., and an extruded body having a diameter of 100 mm was obtained. A copper alloy and Nb were combined using this extruded body according to a two-time stacking technique.

In the second stacking cycle, a Ta alloy as a diffusion barrier was combined with an about 25% copper alloy at the central portion of a wire, and a copper alloy was combined as an outermost layer. A sectional composite ratio of the copper alloy and the Nb core was Nb : copper alloy =1:2.9. The number of Nb filament cores was 3800, the diameter of the filament was about 0.5 $\mu$m, and the outer diameter of the outermost layer was 77 $\mu$m. Test results of these wire samples are shown in Table 6.

Each wire sample was heat-treated in an inert atmosphere at 700° C. for 48 hours. An AC loss of each sample was measured by an evaporation method in a self magnetic field of IT after each sample was formed into a coil shape. From the results shown in Table 6, the Sn concentration distributions in copper alloy matrices of the samples having alloy Nos. 24 and 25 are uniform, no disconnections are found during drawing in these samples to provide excellent workability, and therefore these samples exhibit large Jc value. Non-uniformity and bonding of the sectional shapes of the superconductor filaments of each of the samples having alloy Nos. 24 and 25 are not found, and their AC losses are low. The resistivities of the samples at room temperature upon diffusion reactions are actually measured to calculate limits of the superconductor filament distances. These limits are compared with the actually measured values. It is found that the superconductor filaments of the samples having alloy Nos. 22 and 23 have a high bonding possibility of superconductor filaments. Judging from the above facts and analysis in addition to judgment of composite workability, the samples having alloy Nos. 24 and 25 which satisfy the requirements of the present invention are excellent.

INDUSTRIAL APPLICABILITY

According to the superconductor wires of the present invention, a copper alloy constituting a matrix contains at least one kind of element selected from predetermined element groups, the contents of these elements are determined so that a resistivity calculated by a predetermined formula at room temperature falls within a predetermined range, and a distance between the superconductor filaments is a predetermined value or more determined by the resistivity. The wire has a high critical current density, a small AC loss, and improved composite workability. Therefore, the wires of the present invention are suitable for power system equipment such as a power generator and an energy store, or a linear motor car, an ultra-high energy accelerator, and a nuclear fusion equipment.

TABLE 1

| Sample | Pure Cu Composite Wire | Cu - 5 atm % Si Composite Wire | Cu -3 atom % Ge Composite Wire | Cu - 3 atm % Si - 1 atm % Ge Alloy Composite Wire | Cu—Ni Alloy Composite Wire (Comparative Example) |
|---|---|---|---|---|---|
| Critical Temperature (K) | 8.5 | 8.6 | 8.5 | 8.6 | 7.7 |

TABLE 2

| Element Group | A | B | C | D | E | F | G | H | B | I | J |
|---|---|---|---|---|---|---|---|---|---|---|---|
| Name of Element | Zn | Ni | Al | Mn | Cr | As | Si | Fe | Sn | P | Ti |
| Alloy No. | | | | | | | | | | | |
| 1 | | 10 | | | | | | | | | |
| 2 | | 30 | | | | | | | | | |
| 3 | | | | | | | 2.5 | | | | |
| 4 | | | | | | | 5 | | | | |
| 5 | | | | 1 | | | | | | | |
| 6 | | | | 5 | | | | | | | |
| 7 | | 10 | | | | | 2.5 | 0.1 | | | |
| 8 | 5 | 30 | | | | | | 0.5 | | | |
| 9 | | | | 1 | | | 1 | 0.5 | | | |
| 10 | | | | 3 | | | 1 | 0.5 | | | |
| 11 | | | | 4.5 | | | 1 | 0.1 | | | |
| 12 | | | | 1.5 | | | 2.5 | 0.2 | | | |
| 13 | | | | 0.5 | | | 3.5 | 0.1 | | | |
| 14 | | | | 3 | | | 3.5 | | | | |
| 15 | | | | 1.5 | | | 5 | | | | |
| 16 | 1 | | 0.4 | 5 | 0.1 | 0.05 | | 0.1 | | | |
| 17 | 0.8 | | 2.5 | 5 | 0.2 | 0.05 | | 0.2 | | | |
| 18 | 0.8 | | 5.5 | 5 | 0.1 | 0.05 | | 0.1 | | | |
| 19 | 0.9 | | 5.5 | 10.5 | 0.1 | 0.05 | | 0.1 | | | |
| 20 | 0.9 | | 7.5 | 15 | | 0.05 | | | | | |
| 21 | 0.9 | | 2.5 | 10.5 | 0.2 | 0.05 | | 0.2 | | | |
| 22 | | | | | | | | | 13.5 | 0.001 | 0.3 |
| 23 | | | | | | | | | 13.5 | 0.05 | 0.3 |
| 24 | | 2 | | | | | 0.5 | | 13.5 | 0.001 | 0.3 |
| 25 | 2 | | | | | | 1 | | 14.5 | 0.001 | 0.3 |

TABLE 3

| Alloy No. | Tc (A/mm², 1T) 0.5 mmφ | Tc (A/mm², 1T) 0.1 mmφ | AC Loss (kw/m³, 1T) 0.5 mmφ | AC Loss (kw/m³, 1T) 0.1 mmφ | $P_{0.5}/P_{0.1}$ | Filament Distance (nm) (Calculated Value) | Workability |
|---|---|---|---|---|---|---|---|
| 6 | 6100 | 3600 | 320 | 110 | 2.9 | 140 | X |
| 16 | 6000 | 3500 | 350 | 105 | 3.3 | 130 | 66 |
| 17 | 5700 | 8000 | 360 | 80 | 4.5 | 114 | Δ |
| 18 | 5800 | 4500 | 380 | 100 | 3.8 | 105 | Δ |
| 19 | 5400 | 9500 | 390 | 90 | 4.3 | 84 | Δ |
| 20 | 5500 | 5800 | 350 | 120 | 2.9 | 72 | X |
| 21 | 5000 | 4000 | 355 | 130 | 2.7 | 88 | Δ |

TABLE 4

| Alloy No. | Workability (Frequency of Disconnection) Up to 0.5 mm$\phi$ | Workability (Frequency of Disconnection) Up to 0.1 mm$\phi$ | Twist Pitch Multiple with Respect to wire Diameter in Wires Worked up to 0.1 mm$\phi$ | AC Loss (kw/m³, 1T) 0.5 mm$\phi$ | AC Loss (kw/m³, 1T) 0.1 mm$\phi$ | $P_{0.5}/P_{0.1}$ | Resistivity of Copper Alloy ($10^{-8}$ $\Omega$m, RT, Measured Value) | Filament Distance (nm) (Calculated Value) |
|---|---|---|---|---|---|---|---|---|
| 3 | 2 | 15 | 20 | 302 | 95 | 3.2 | 19.7 | 140 |
| 4 | 1 | 20 | 40 | 350 | 120 | 2.9 | 37.7 | 102 |
| 5 | 5 | 25 | 15 | 320 | 150 | 2.1 | 5.3 | 271 |
| 6 | 2 | 10 | 20 | 305 | 93 | 3.2 | 19.7 | 140 |
| 9 | None | None | 5 | 305 | 65 | 4.7 | 18.5 | 145 |
| 10 | None | None | 5 | 300 | 60 | 5.0 | 25.7 | 123 |
| 11 | 1 | 5 | 10 | 270 | 90 | 3.0 | 26.3 | 122 |
| 12 | None | None | 5 | 285 | 58 | 4.9 | 27.5 | 119 |
| 13 | None | None | 4 | 290 | 65 | 4.5 | 29.9 | 114 |
| 14 | None | 5 | 15 | 275 | 90 | 3.0 | 37.7 | 102 |
| 15 | 1 | 10 | 15 | 280 | 95 | 2.9 | 43.1 | 95 |

TABLE 5

| Alloy No. | Workability (Frequency of Disconnections) Up to 0.5 mm$\phi$ | Workability (Frequency of Disconnections) Up to 0.1 mm$\phi$ | Jc (A/mm², 1t) 0.5 mm$\phi$ | Jc (A/mm², 1t) 0.1 mm$\phi$ | AC Loss (kw/m², 1T) 0.5 mm$\phi$ | AC Loss (kw/m², 1T) 0.1 mm$\phi$ | Resistivity of Copper ($10^{-8}$ $\Omega$m, RT, Measured Value) |
|---|---|---|---|---|---|---|---|
| 1 | None | High in 0.3 mm$\phi$ or less | 5400 | 3600 | 300 | 100 | 16.4 |
| 2 | High in 2 mm$\phi$ or less | High | 5300 | 3500 | 280 | 60 | 38.4 |
| 7 | None | None | 6000 | 4700 | 290 | 85 | 32.9 |
| 8 | None | None | 7000 | 4500 | 300 | 50 | 46.7 |

TABLE 6

| Alloy No. | Sn Distribution (wt %) of First Stack Group | Workability (Frequency of Disconnections) | Jc A/mm², 10T | AC Loss (kw/m³, 1T) | Resistivity Copper Alloy ($10^{-8}$ $\Omega$m, RT, Measured Value) | Filament Distance (nm) Calculated Value | Filament Distance (nm) Measured Value |
|---|---|---|---|---|---|---|---|
| 22 | ±1 | 10 | 400 | 500 | 6.9 | 237 | 185 |
| 23 | ±1.3 | 15 | 600 | 900 | 7.8 | 223 | 190 |
| 24 | ±0.3 | None | 1000 | 300 | 13.0 | 174 | 192 |
| 25 | ±0.2 | None | 1500 | 250 | 15.3 | 159 | 190 |

We claim:

1. A superconductor wire for an AC magnetic field or a pulsed magnetic field comprising:

a plurality of Nb—Ti superconductor filaments embedded in a copper matrix made of a Cu—Si—Mn—Fe alloy, the alloy being workable to a fine wire of a diameter of at least as small as 0.1 mm, the copper matrix having a resistivity (Z) of $2\times10^{-8}$ $\Omega$m to $65\times10^{-8}$ $\Omega$m, and a distance between the Nb—Ti superconductor filaments being not less than $0.0625\times1/\sqrt{Z}$ nm, wherein the copper matrix contains 1 weight % Mn, 1 weight % Si and 0.5 weight % Fe.

2. The superconductor wire according to claim 1, wherein the alloy is workable to a fine wire of a diameter of 0.5 mm to 0.1 mm.

3. A superconductor wire for an AC magnetic field or a pulsed magnetic field comprising:

a plurality of Nb—Ti superconductor filaments embedded in a copper matrix made of a Cu—Si—Mn—Fe alloy, the alloy being workable to a fine wire of a diameter of at least as small as 0.1 mm, the copper matrix having a resistivity (Z) of $2\times10^{-8}$ $\Omega$m to $65\times10^{-8}$ $\Omega$m, and a distance between the Nb—Ti superconductor filaments being not less than $0.0625\times1/\sqrt{Z}$ nm, wherein the copper matrix contains 1.5 weight % Mn, 2.5 weight % Si and 0.2 weight % Fe.

4. The superconductor wire according to claim 3, wherein the alloy is workable to a fine wire of a diameter of 0.5 mm to 0.1 mm.

5. A superconductor wire for an AC magnetic field or a pulsed magnetic field comprising:

a plurality of Nb—Ti superconductor filaments embedded in a copper matrix made of a Cu—Si—Mn—Fe alloy, the alloy being workable to a fine wire of a diameter of at least as small as 0.1 mm, the copper matrix having a resistivity (Z) of $2 \times 10^{-8}$ $\Omega$m to $65 \times 10^{-8}$ $\Omega$m, and a distance between the Nb—Ti superconductor filaments being not less than $0.0625 \times 1/\sqrt{Z}$ nm, wherein the copper matrix contains 0.5 weight % Mn, 3.5 weight % Si and 0.1 weight % Fe.

6. The superconductor wire according to claim 5, wherein the alloy is workable to a fine wire of a diameter of 0.5 mm to 0.1 mm.

7. A superconductor wire for an AC magnetic field or a pulsed magnetic field comprising:

a plurality of Nb—Ti superconductor filaments embedded in a copper matrix made of a Cu—Si—Mn—Fe alloy, the alloy being workable to a fine wire of a diameter of at least as small as 0.1 mm, wherein the copper matrix contains 1 weight % Mn, 1 weight % Si and 0.5 weight % Fe.

8. The superconductor wire according to claim 7, wherein the alloy is workable to a fine wire of a diameter of 0.5 mm to 0.1 mm.

9. A superconductor wire for an AC magnetic field or a pulsed magnetic field comprising:

a plurality of Nb—Ti superconductor filaments embedded in a copper matrix made of a Cu—Si—Mn—Fe alloy, the alloy being workable to a fine wire of a diameter of at least as small as 0.1 mm, wherein the copper matrix contains 1.5 weight % Mn, 2.5 weight % Si and 0.2 weight % Fe.

10. The superconductor wire according to claim 9, wherein the alloy is workable to a fine wire of a diameter of 0.5 mm to 0.1 mm.

11. A superconductor wire for an AC magnetic field or a pulsed magnetic field comprising:

a plurality of Nb—Ti superconductor filaments embedded in a copper matrix made of a Cu—Si—Mn—Fe alloy, the alloy being workable to a fine wire of a diameter of at least as small as 0.1 mm, wherein the copper matrix contains 0.5 weight % Mn, 3.5 weight % Si and 0.1 weight % Fe.

12. The superconductor wire according to claim 11, wherein the alloy is workable to a fine wire of a diameter of 0.5 mm to 0.1 mm.

* * * * *